US008243476B2

(12) United States Patent
Ribarich

(10) Patent No.: US 8,243,476 B2
(45) Date of Patent: *Aug. 14, 2012

(54) HEMT/GAN HALF-BRIDGE CIRCUIT

(75) Inventor: Thomas Ribarich, Laguna Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/108,259

(22) Filed: May 16, 2011

(65) Prior Publication Data

US 2011/0216563 A1 Sep. 8, 2011

Related U.S. Application Data

(63) Continuation of application No. 12/118,027, filed on May 9, 2008, now Pat. No. 7,961,482.

(60) Provisional application No. 60/916,913, filed on May 9, 2007.

(51) Int. Cl.
*H02M 3/335* (2006.01)

(52) U.S. Cl. .................. 363/21.03; 323/274; 315/291

(58) Field of Classification Search .................. 315/194, 315/205, 219, 225, 291, 307, 224, 244, 209 R; 363/16–20, 21.03, 21.07, 80, 98, 127, 132, 363/84, 89, 95, 97, 137; 323/207, 222, 225, 323/235, 282–288, 299, 271–275, 280, 229, 323/318

See application file for complete search history.

(56) References Cited

U.S. PATENT DOCUMENTS

| 4,556,827 | A | * | 12/1985 | Erdman | 318/400.3 |
| 5,737,203 | A | * | 4/1998 | Barrett | 363/75 |
| 5,977,725 | A | * | 11/1999 | Miyazaki et al. | 315/291 |
| 6,861,828 | B2 | * | 3/2005 | Watanabe | 323/282 |
| 7,054,117 | B2 | * | 5/2006 | Ho et al. | 360/324.12 |
| 7,145,786 | B2 | * | 12/2006 | Vinciarelli | 363/17 |

* cited by examiner

*Primary Examiner* — Rajnikant Patel
(74) *Attorney, Agent, or Firm* — Farjami & Farjami LLP

(57) ABSTRACT

A half-bridge circuit in accordance with an embodiment of the present application includes an input voltage terminal operable to receive an input voltage, a first bi-directional switch, a second bi-directional switch connected in series with the first bi-directional switch, wherein the first and second bi-directional switches are connected to the input voltage terminal such that the input voltage is provided across the first and second bi-directional switches and a controller operable to turn the first and second bi-directional switches ON and OFF such that a desired voltage is provided at an midpoint node positioned between the first bi-directional switch and the second bi-directional switch. The first bi-directional switch and the second bi-directional switch are high electron mobility transistors structured to allow for conduction in two directions when ON and to prevent conduction in any direction when OFF.

10 Claims, 16 Drawing Sheets

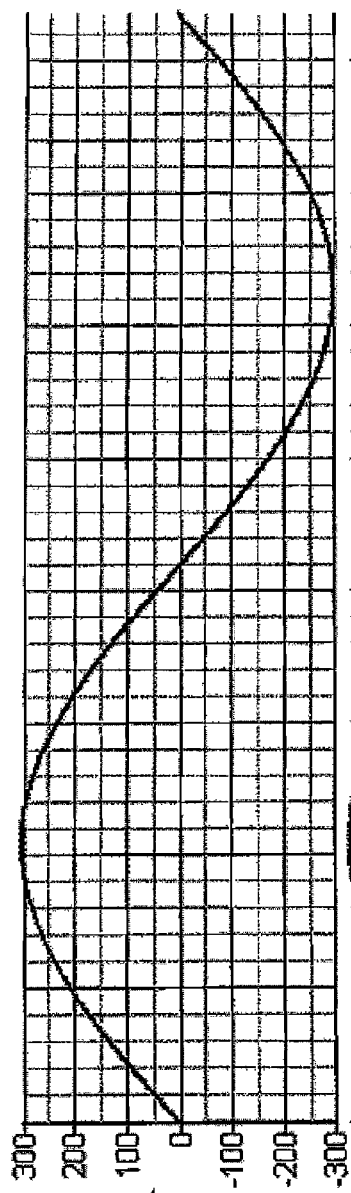
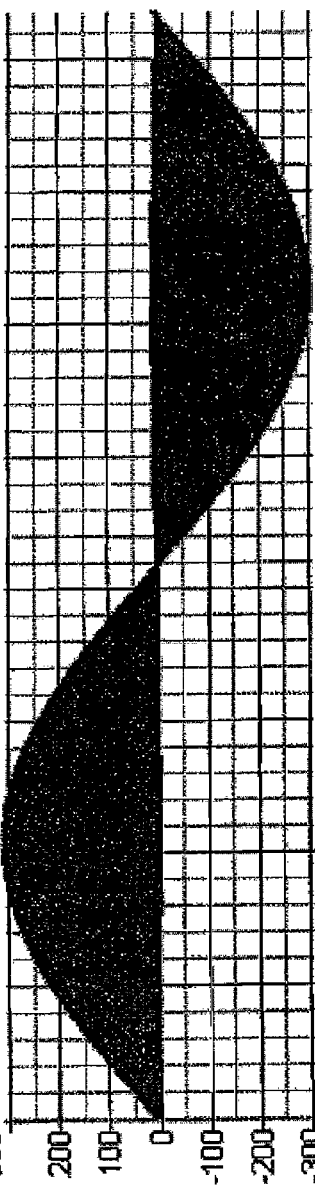
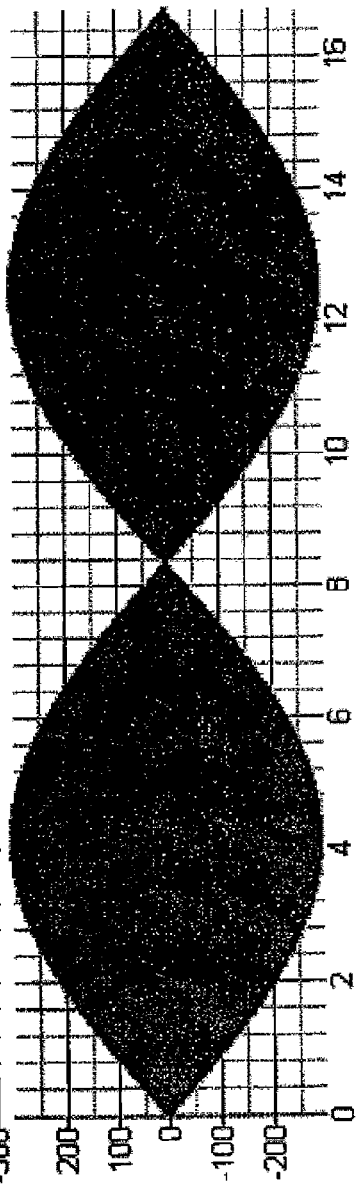
Fig. 5A
Fig. 5B
Fig. 5C

HEMT/GAN HALF-BRIDGE CIRCUIT

This is a continuation of application Ser. No. 12/118,027 filed May 9, 2008 now U.S. Pat. No. 7,961,482.

CROSS REFERENCE TO RELATED APPLICATIONS

The present application claims benefit of and priority to U.S. Provisional Patent Application Ser. No. 60/916,913 for BI-DIRECTIONAL HEMT/GaN HALF-BRIDGE AND SINGLE STAGE RESONANT AND PFC CIRCUIT filed May 9, 2007, the entire contents of which are hereby incorporated by reference herein.

The present application is also related to concurrently filed U.S. application Ser. No. 12/118,320 filed May 9, 2008 entitled CLASS D AMPLIFIER WITH BI-DIRECTIONAL POWER SWITCH which claims benefit of and Priority to U.S. Provisional Patent Application Ser. No. 60/941,395 for CLASS D AMPLIFIER WITH BI-DIRECTIONAL POWER SWITCH filed Jun. 1, 2007, the entire contents of both of which are hereby incorporated by reference herein.

BACKGROUND

1. Field of the Disclosure

The present invention relates to a half-bridge circuit utilizing bi-directional HEMT/GaN transistors.

2. Related Art

The traditional half-bridge circuit, sometimes known as an inverter, is one of the most fundamental circuit switch configurations used in power electronics today. Half-bridges are commonly used in a wide variety of applications, including electronic ballasts for lighting, class-D audio amplifiers, resonant mode power supplies and motor drive circuits. The typical half-bridge circuit 10 is illustrated in FIG. 1 and includes two switches M1, M2 connected in a totem poll configuration between a DC bus and ground. The switches are typically MOSFETsS or IGBTs.

The drain of the upper (high side) MOSFET M1 in FIG. 1 is connected to the DC bus voltage which is generally several hundreds of volts. If M1 were an IGBT, the collector would be connected to the DC bus voltage. The source of the second (low side) MOSFET M2 in FIG. 1 is connected to ground. Two free flowing diodes D1 and D2 are placed in parallel with the switches M1, M2, respectively, with the cathode connected to the drain and the anode connected to the source. In this manner, the half-bridge is formed and converts the DC bus voltage into a square-wave voltage. A half-bridge control circuit 12 controls the on-off times of each of the switches M1, M2. The circuit 12 provides the correct timing of the voltages at the gates of the switches M1, M2 to set a desired frequency, duty cycle and dead time for the square wave. The mid-point node VS of the half-bridge is typically connected to a resonant type load circuit (L1, RLOAD, C1, C2). A snubber capacitor CSNUB is preferably connected between node VS and ground, or between VS and the DC bus, to control the dv/dt of the rising and falling edges of the square wave. The diodes D1, D2 provide a current path during the dead time when neither switch is active to maintain a continuous current through the load.

When M1 turns ON, current flows from the DC bus, through M1 and through the load circuit to ground. When M1 turns off, current continues to flow out of the snubber capacitor CSNUB through the load to ground. As current flows out of the capacitor CSNUB, the voltage at node VS discharges linearly to ground at a rate provided by the following equation:

$$dv/dt = I*CSNUB.$$

When the voltage at VS reaches 0.7 V below ground, the lower diode D2 will become forward biased and current will continue to flow from ground through diode D2 and through the load back to ground. At some point after the voltage at VS reaches ground, the dead time will end and the switch M2 will turn ON. The load current will transition from diode D2 to the channel of switch M2. When the load current changes direction due to the resonant nature of the circuit, the current will continue to flow from the load through the switch M2 and to ground. When M2 is turned OFF, the load current will flow into CSNUB and charge the node VS up linearly at a rate defined by the equation:

$$dv/dt = I*CSNUB.$$

When the voltage at node VS reaches 0.7 volts above the DC bus voltage, the diode D1 will become forward biased and current will flow from ground, through the load, through D1 to the DC bus and through capacitors C1, C2 and back to ground. When the dead time is over, M1 will turn on and the cycle repeats. Thus, using the MOSFETs and the diodes D1, D2 allows for smooth and continuous current in both positive and negative directions.

When the half-bridge 10 is connected to an AC line voltage source 14, which serves and an input voltage, as illustrated in FIG. 2, for example, it is necessary to provide a bridge rectifier 4 to allow for bi-directional current flow from the AC line input voltage. FIG. 3A illustrates the AC line voltage. FIG. 3B illustrates the rectified voltage provided by the rectifier bridge 4. FIG. 3C illustrates the voltage at the node VS.

The rectifier bridge 4 keeps the voltage at the drain of the high side MOSFET M1 (or IGBT) always equal to, or above ground. This is important since if the DC bus voltage goes negative, the diodes D1 and D2 will be forward biased at the same time and a short circuit will result. The short circuit will result in the square wave becoming non-functional while the high current damages circuit components. Utilizing the bridge 4, however, the voltage at node VS will transition between the DC bus voltage and ground continuously at a certain frequency and duty cycle, as is illustrated in FIG. 3C. The amplitude of the square wave is given by the DC bus voltage level. If the capacitors C1, C2 are small, the amplitude follows the peak rectified voltage as shown in FIG. 3C.

Where MOSFETs are used, the channel allows for current to flow bi-directionally, however, the diodes D1 and D2 are inherent to the devices and cannot be removed. If IGBT switches are used, the switches conduct in only one direction, from the collector to the emitter, and thus, diodes must be added to provide bi-directional current flow.

Accordingly, it would be beneficial to provide a half-bridge circuit that allows bi-directional current flow without the need for the additional diodes described above.

SUMMARY OF THE INVENTION

It is an object of the present invention to provide a half-bridge circuit using bi-directional HEMT devices that allow for bi-directional current flow without the need for additional diodes.

A half-bridge circuit in accordance with an embodiment of the present application includes an input voltage terminal operable to receive an input voltage, a first bi-directional switch, a second bi-directional switch connected in series with the first bi-directional switch, wherein the first and second bi-directional switches are connected to the input voltage terminal such that the input voltage is provided across the first and second bi-directional switches and a controller operable to turn the first and second bi-directional switches ON and OFF such that a desired voltage is provided at an midpoint node positioned between the first bi-directional switch and the second bi-directional switch. The first bi-directional switch and the second bi-directional switch are high electron mobility transistors structured to allow for conduction in two directions when ON and to prevent conduction in any direction when OFF.

Other features and advantages of the present invention will become apparent from the following description of the invention which refers to the accompanying drawings.

BRIEF DESCRIPTION OF THE DRAWING(S)

FIG. 5A is a graph illustrating the waveform of the input AC line voltage in the half-bridge circuit of FIG. 4;

FIG. 5B is a graph illustrating the waveform of the voltage at the node VS in the half-bridge circuit of FIG. 4;

FIG. 5C is a graph illustrating the waveform of the inductor and load current in the half-bridge circuit of FIG. 4;

DETAILED DESCRIPTION OF THE EMBODIMENTS

Figure 4:
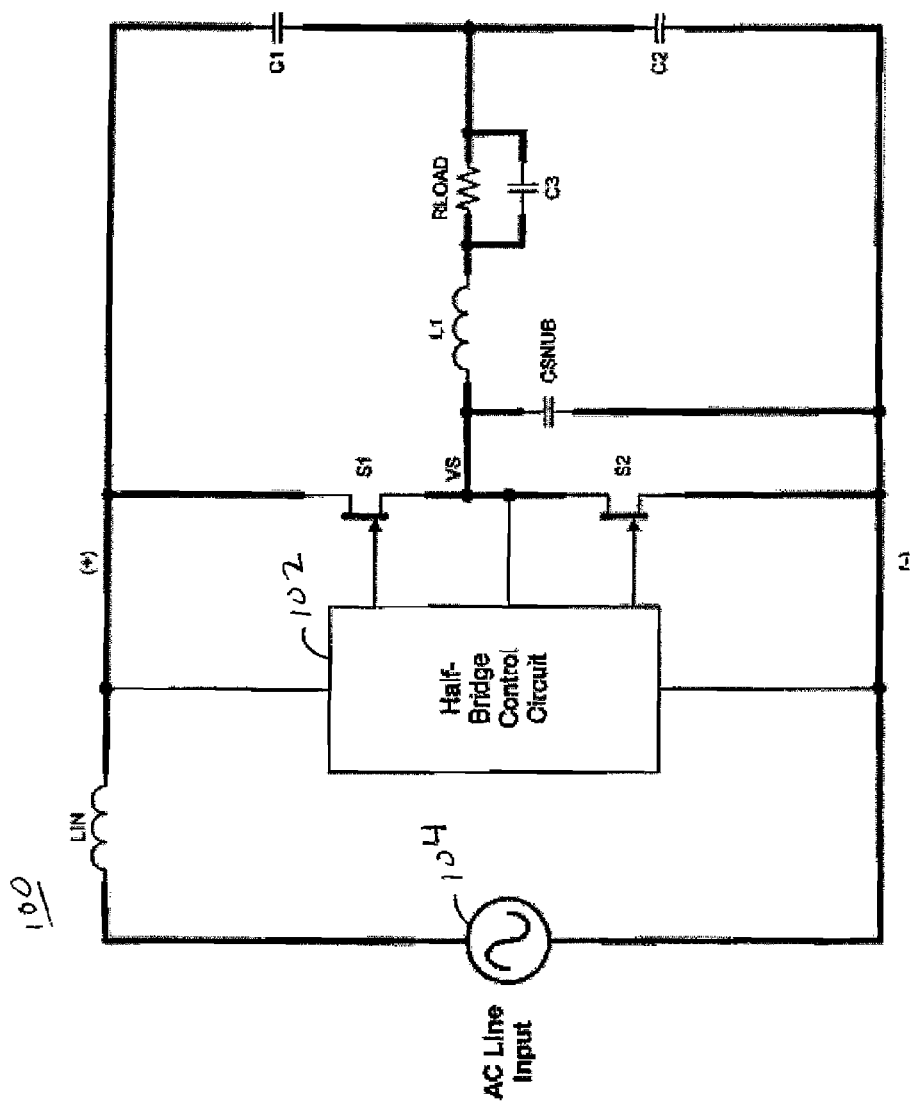
FIG. 4 is an illustration of a half-bridge circuit in accordance with an embodiment of the present application.

The half-bridge circuit 100, illustrated in FIG. 4 of the present application, uses high electron mobility transistors (HEMTs) as switches. HEMTs are preferably made using Galium Nitride and provide for bi-directional current flow without the need for the diodes D1, D2 discussed above with reference to FIG. 1. Two GaN HEMT devices, or switches (S1 and S2) are positioned in a totem pole configuration to realize a bi-directional half-bridge 100. The top and bottom switches S1, S2 of the half-bridge 100 are connected directly to the AC line input voltage source 104 after the EMI filter (inductor L1). Thus, there is no need for a bridge rectifier as in the circuit of FIG. 1. The circuit 100 also includes a control circuit 105 to control the timing of the half-bridge, a snubber capacitor CSNUB, connected from the node VS to the negative input terminal (−) of the AC line voltage (or alternatively between the node VS and the positive input terminal (+) of the AC line voltage). A series inductor L1 and parallel resistor RLOAD and capacitor C3 form a resonant load circuit. The capacitors C1 and C2 are connected in series between the positive (+) and negative (−) input terminals of the AC line voltage. The resonant circuit (RLOAD, C3) is connected between the VS node and the midpoint of the capacitors C1, C2.

The peak amplitude of the waveform at the node VS directly follows the positive and negative peak amplitude of the AC line voltage as can be seen in FIG. 4B. When the (+) terminal of the AC line voltage is positive with respect to the negative (−) terminal of the line voltage (see FIG. 5A), the VS node is positive and continuously switching between the positive and negative voltage values at a given frequency, duty cycle and dead time. When the (+) terminal of the AC line voltage is negative with respect to the (−) terminal of the AC line, the voltage at the node VS is negative and is continuously switching between the negative and positive input values at a given frequency, duty cycle and dead time. During the positive and negative peak amplitude swings of the AC line input voltage, the half-bridge peak amplitude goes positive and negative as well, but the inductor current peak amplitude through L1 (see FIG. 5C) swings positive and negative equally above and below zero as it oscillates during high-frequency switching cycle of the half-bridge 100.

Figure 6:
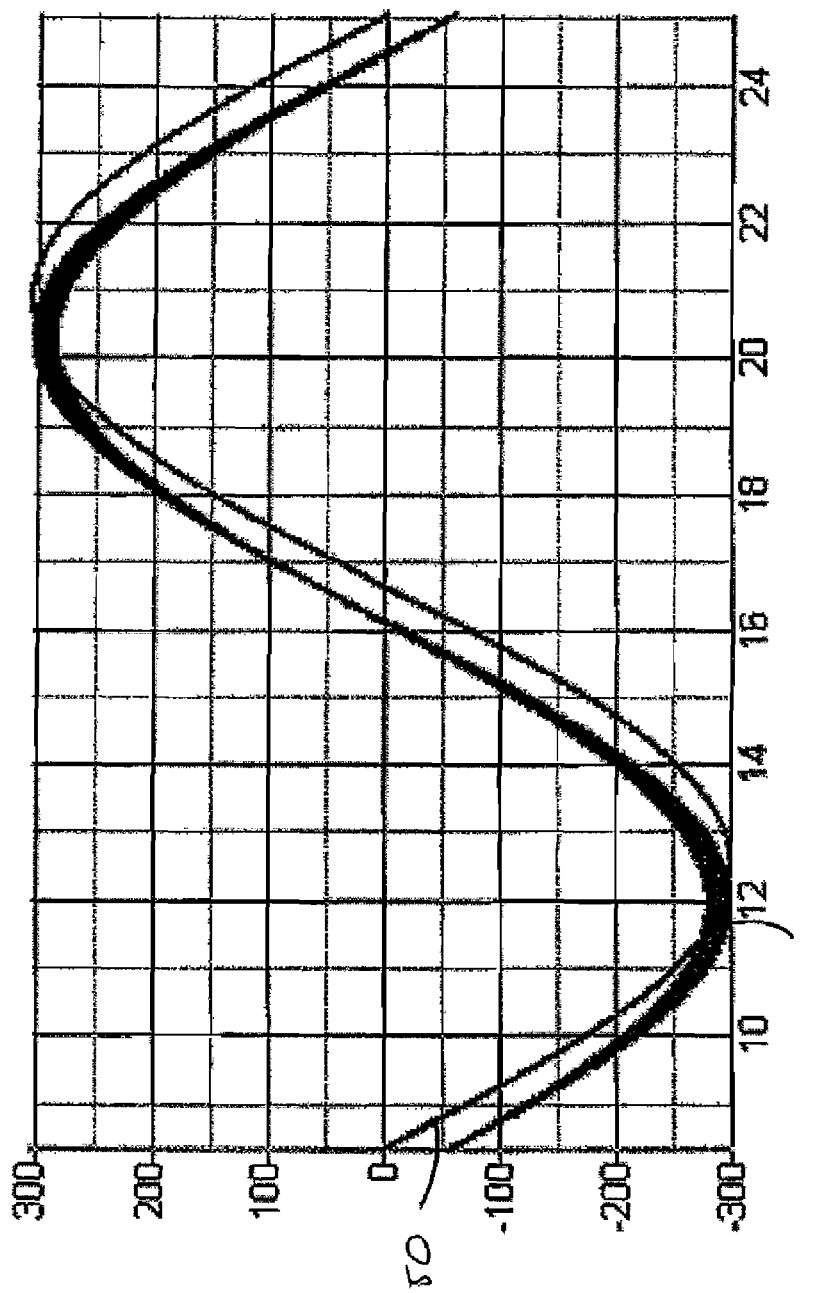
FIG. 6 is a graph illustrating the AC line input voltage and the AC line input current in the circuit of FIG. 4.

When the inductor current through L1 is smoothed with the inductor LIN of the EMI filter, the result is an AC input line current 52 that is sinusoidal and almost in phase with the AC input line voltage 50 as illustrated in FIG. 6. The AC half-bridge driven series L1, parallel RLOAD and C3 circuit automatically produces a high power factor and very low total harmonic distortion (THD) in a single stage. Traditional solutions require a separate PFC converter at the front of the circuit to actively correct power factor and actively shape the current to match the sinusoidal shape of the AC line voltage.

During the time when the voltage at the (+) terminal of the AC line is positive with respect to the voltage at the (−) terminal thereof, the bi-directional inductor current flow through L1 is maintained. When the switch S1 is turned ON, switch S2 is OFF and the VS node of the half-bridge is connected to the (+) terminal of the AC line voltage. The inductor current, through L1, flows from the (+) terminal through the switch S1, through the inductor and the load. Then half of the current flows through the upper capacitor C1 and half through the lower capacitor C2. When the switch S1 is turned OFF, the dead-time period begins and the inductor current through L1 flows in the snubber capacitor CSNUB, through the inductor L1 and then splits equally between C1 and C2. The voltage at node VS ramps down linearly to zero at a rate given by:

$$dv/dt = I*CSNUB$$

When the VS node reaches the (−) terminal of the AC line, the dead time period ends, the lower switch S2 turns ON and the node VS of the half-bride is connected to the (−) terminal of the AC line. The inductor current of L1 no longer flows through CSNUB and now flows through switch S2, through the inductor L1 and then splits equally through C1 and C2. When switch S2 turns OFF, the dead time period begins again and the voltage at node VS ramps up linearly at the following rate:

$$dv/dt = I*CSNUB$$

Figure 7:
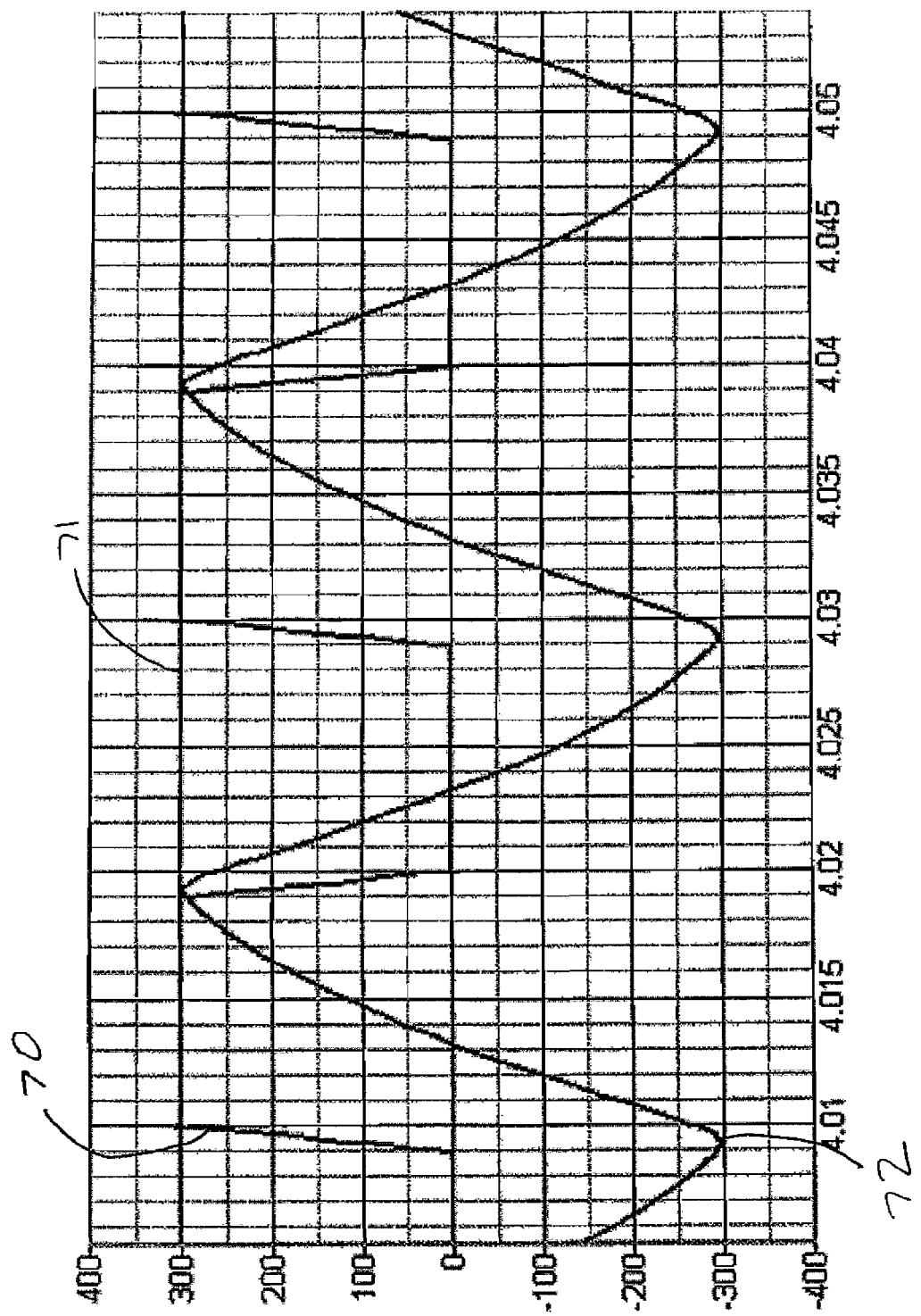
FIG. 7 is a graph illustrating the waveform of the voltage at node VS and the inductor and load current when the voltage at the positive terminal of the AC line input voltage is positive relative to that of the negative terminal in the circuit of FIG. 4.

When the voltage at node VS reaches the voltage at the (+) terminal of the AC line, switch S1 turns ON again and the cycle repeats. The VS node continues to transition back and forth between the (+) terminal voltage and zero at the given frequency, duty-cycle and dead time. FIG. 7 illustrates the waveform of the voltage at the node VS as trace 70 which switches between 0 and the positive peak amplitude of the AC line voltage. Trace 71 illustrates the peak positive AC line voltage while the trace 72 illustrates to continuous inductor and load voltage.

Figure 8:
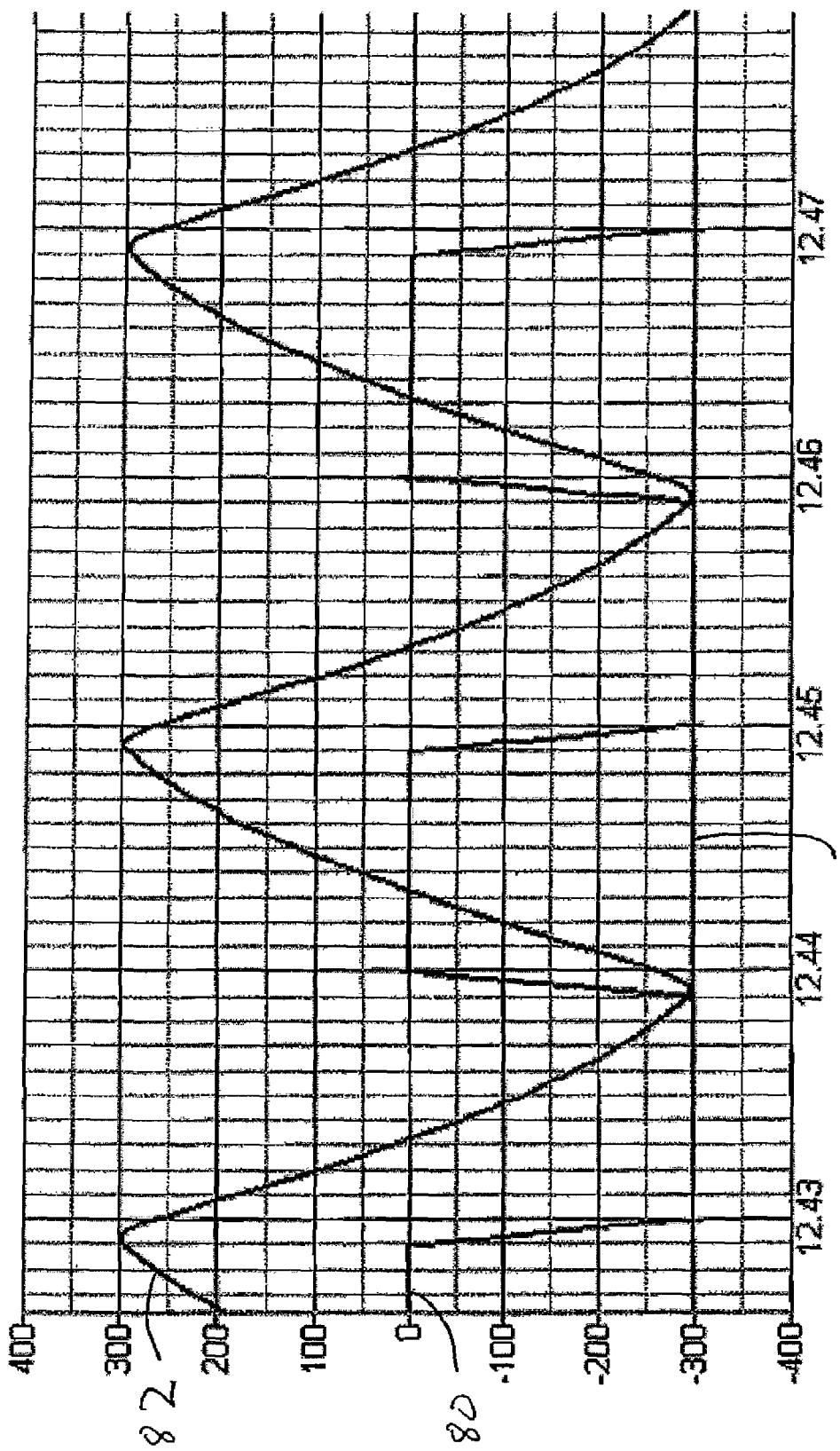
FIG. 8 is a graph illustrating the waveform of the voltage at node VS and the inductor and load current when the voltage at the positive terminal of the AC line input voltage is negative relative to that of the negative terminal in the circuit of FIG. 4.

FIG. 8 illustrates the same waveforms as FIG. 7 during the time when the (+) terminal of the AC line voltage is negative with respect to the (−) terminal of the AC line voltage. The inductor bi-directional current flow is also maintained as is illustrated by trace 82. The timing of the switches S1, S2 remains the same, and the only difference now is that now the (+) terminal of the AC line is negative with respect to the (−) terminal so that the voltage at the VS node voltage indicated by trace 80 transitions between zero and a negative peak amplitude of the AC line voltage (trace 81) at the given frequency, duty-cycle and dead time.

Figure 9:
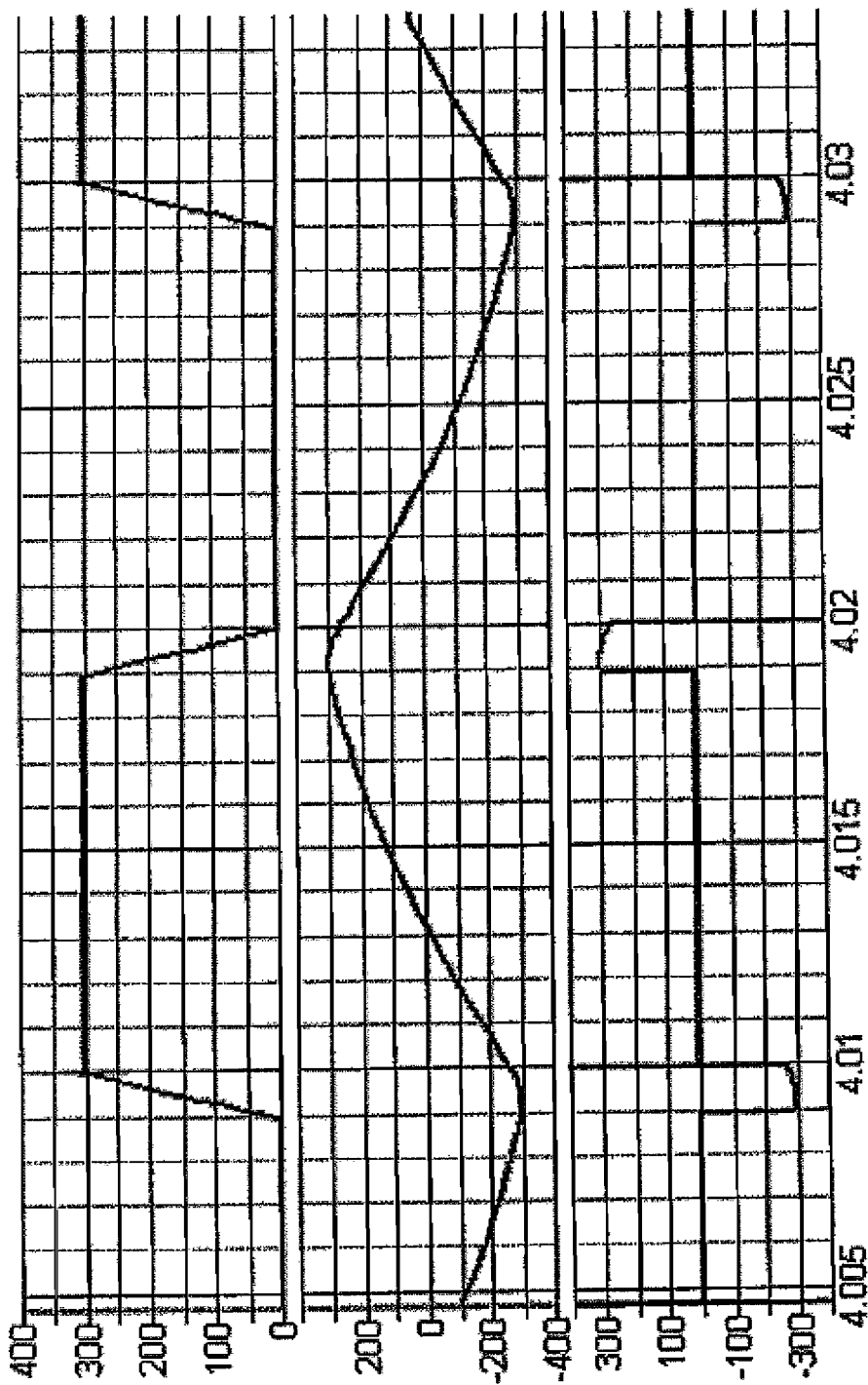
FIG. 9A is a graph illustrating the waveform of the voltage at node VS in the circuit of FIG. 4.
FIG. 9B is a graph illustrating the waveform of the inductor and load current in the circuit of FIG. 4.
FIG. 9C is a graph illustrating the waveform of the capacitor current in the circuit of FIG. 4.

In a preferred embodiment, the half-bridge circuit 100 also includes zero-voltage crossing (ZVS) circuit 200 (see FIG. 4) which is preferably implemented in the control circuit 102. The zero voltage crossing circuit 200 may be implemented in any desired manner, but is preferably integrated into controller 102. The ZVS circuit 200 is useful because no free flowing diodes can be used due to the direct connection between the AC input line voltage and the half-bridge circuit 100. The ZVS circuit 200 is active during the dead time to detect exactly when the voltage at the VS node has slewed completely to the (−) terminal line connection before turning on the low-side switch S2 and conversely detects exactly when the VS node has slewed completely to the (+) terminal line input before turning on the high side switch S1. By precisely controlling the turn on of each switch at zero volts, the load current will transition directly from the snubber capacitor CSNUB to the switch S1 or S2 without the need for the free flowing diodes. In FIG. 9A, the waveform of the voltage at node VS is illustrated. FIG. 9B illustrates the inductor and load current while FIG. 9C illustrates the snubber capacitor current of CSNUB. The ZVS circuit 200 ensures that continuous current is maintained to the inductor and load as is illustrated.

Figure 10:
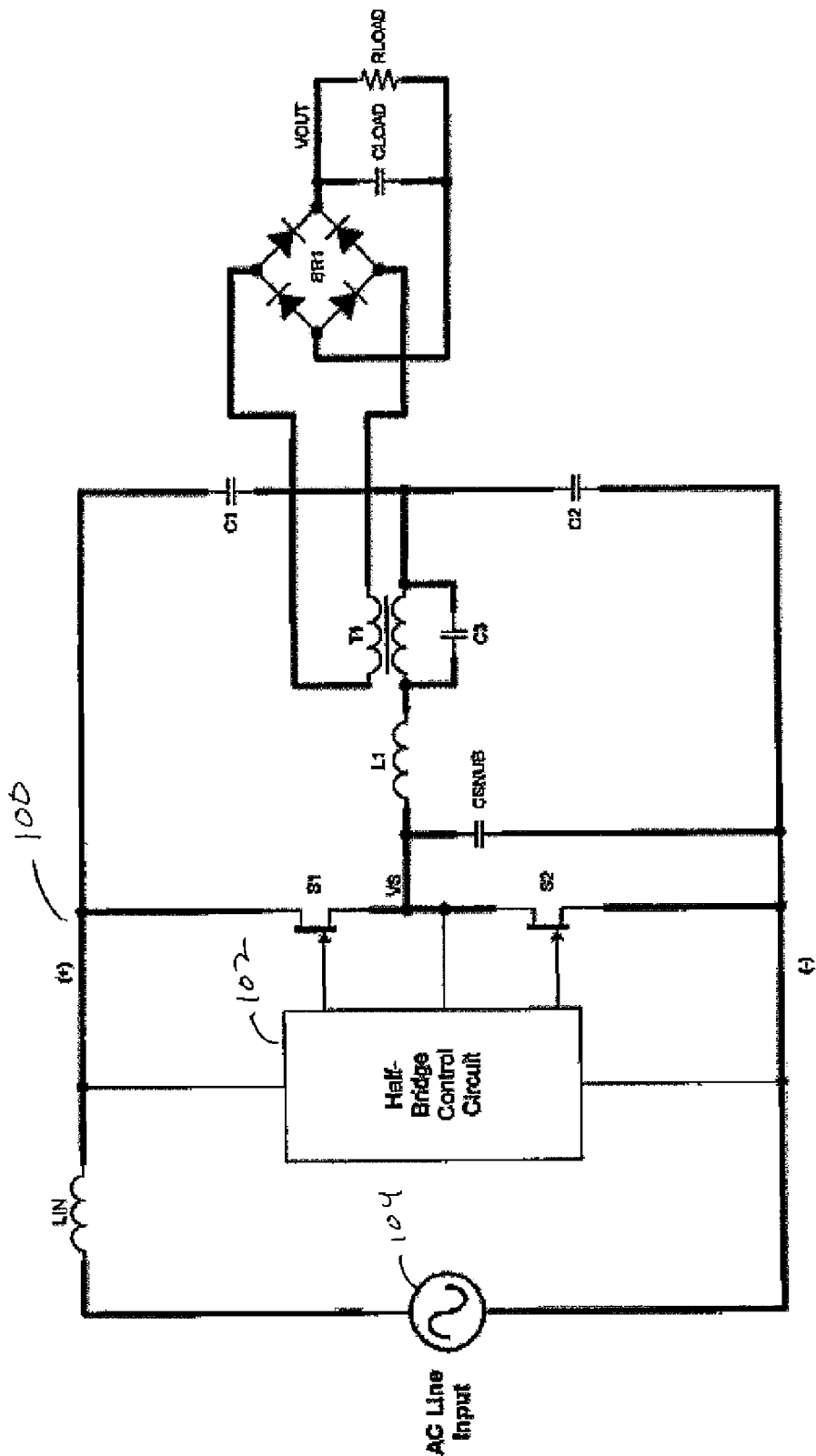
FIG. 10 is an illustration of a half-bridge circuit in accordance with another embodiment of the present application.

FIG. 10 illustrates a complete circuit for producing an isolated output voltage using the half-bridge circuit 100 discussed above. That is, the output voltage VOUT provided to the load in FIG. 10 is isolated from the high voltage AC input line voltage. A transformer T1 and bridge rectifier BR1 are provided between the node VS and output circuit (CLOAD, RLOAD). The transformer secondary to primary winding ratio determines the step up or step down ratio and therefore determines the desired output voltage VOUT. In contemporary isolated circuits, a low frequency AC line voltage is converted to DC via the rectifier at the input then converted back to high frequency AC through the half-bridge and then to the final DC output through the bridge rectifier and smoothing capacitor at the output. In the circuit of FIG. 10, a low frequency AC voltage is input and converted to a high frequency AC voltage at the half-bridge 100, to provide an isolated output voltage VOUT to the load RLOAD through the bridge rectifier BR1 and smoothing capacitor COUT. The AC to DC step is removed at the input and high power factor is inherently provided. The circuit of FIG. 10 operates in substantially the same manner as that of FIG. 4 except that the transformer T1 and bridge BR1 provide for isolation between the high voltage AC line voltage and the load.

The half-bridge circuit of the present application may be used in a variety of applications that require a half-bridge circuit. The half-half-bridge circuit of the present application however allows for direct connection to an AC line voltage and thus eliminates the need for a DC bus and rectifier.

Figure 11:
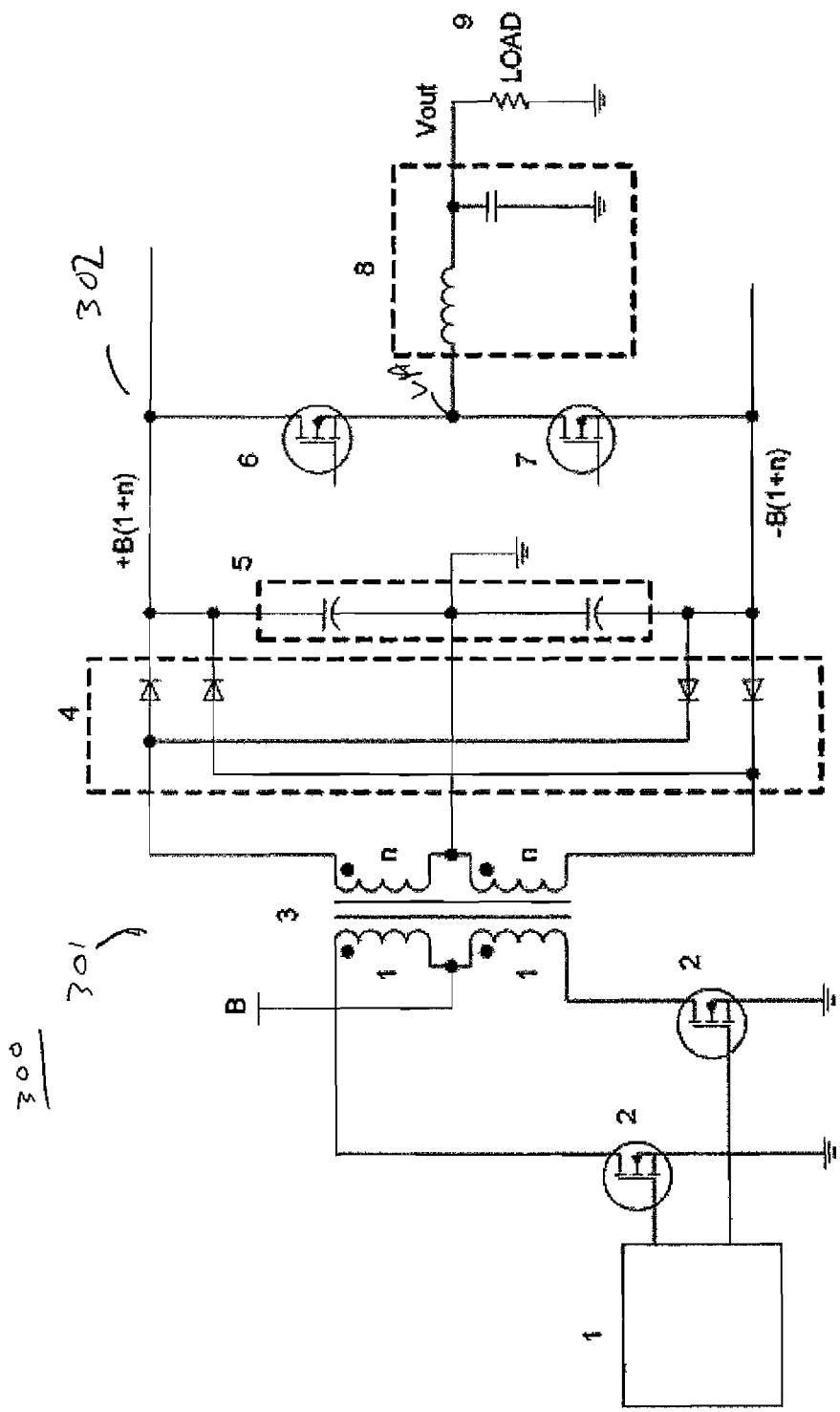
FIG. 11 is an illustration of a conventional Class D amplifier circuit.

One exemplary and non-limiting application for half-bridge circuit is in Class D amplifiers. FIG. 11 illustrates an example of a conventional Class D amplifier. In a conventional power amplifier, there are typically two stages, a DC/DC converter stage 301 that provides a desired bus voltage and the Class D amplifier stage 302. Each stage is built based on one of the switching power supply topologies. In these systems, the bus capacitors 5 at the output of the converter stage 301 consume considerable space. The losses in a system such as that illustrated in FIG. 11 are primarily from four items, the primary switch or switches 2, the transformer 3, the secondary rectifier 4 and the Class D amplifier switch, or switches 6, 7.

Generally, the control circuit 1 controls the primary switched 2 to provide a desired voltage to the primary coils of the transformed 3. The secondary coils of the transformer 3 are connected to the rectifier 4 which rectifies the voltage induced in the secondary coils by the input voltage at the primary coils. This rectified voltage is used to provide a DC bus voltage across the bus capacitors 5. This DC bus voltage is in turn provided to the Class D amplifier stage 302.

Figures 12A, 12B:
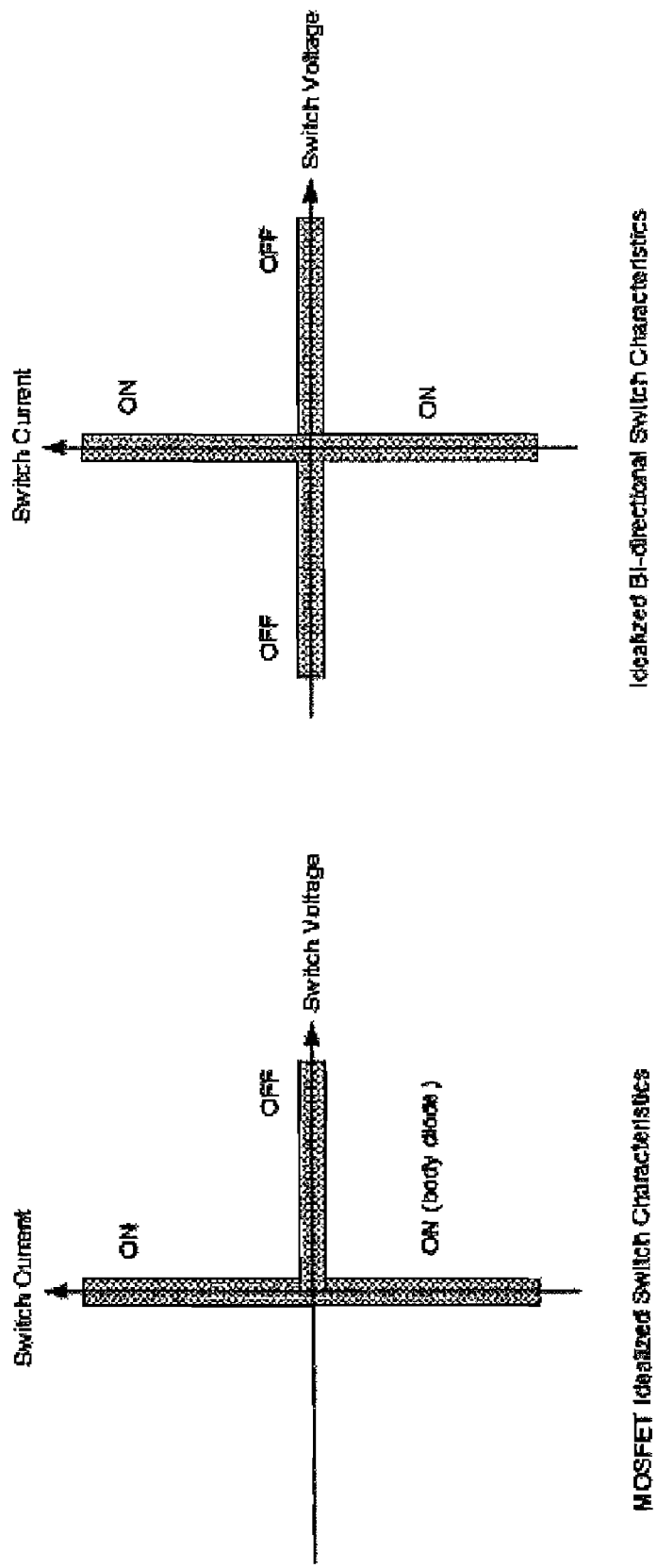
FIG. 12A illustrates characteristics of a conventional MOSFET switch.
FIG. 12B illustrates characteristics of a bi-directional switch for use in the Class D amplifier circuit of the present application.

In the circuit of FIG. 11, in order to obtain higher and/or bipolar bus voltages, the switched mode power supply converts input voltage into a bus voltage for the Class D amplifier. Since Class D amplifiers require a DC bus voltage, the secondary output of the switched mode power supply is fed to rectifier 4 and charges the bus capacitors 5. The Class D amplifier typically uses power MOSFETs as the switches 6, 7. As is noted above, MOSFETs have intrinsic body diodes. These body diodes limit conduction area to three quadrants as is illustrated in FIG. 12A.

A Class D amplifier circuit 400 in accordance with the present application utilizes bi-directional power switching devices such as the HEMT GaN devices described above in place of the MOSFETs described above. An HEMT GaN device allows conduction in all four quadrants, as is illustrated in FIG. 12B, for example. Utilizing these switches in the Class D amplifier stage 402 allows the use of an AC input voltage. Further, using these bi-directional switches, output PWM is provided directly from bipolar power supply output pulses. The Class D amplifier of the present application thus eliminates the need for the lossy secondary rectifier 4, illustrated in FIG. 11, for example. In addition, the bus capacitor 5 can also be eliminated since the DC bus is no longer necessary.

Figure 1:
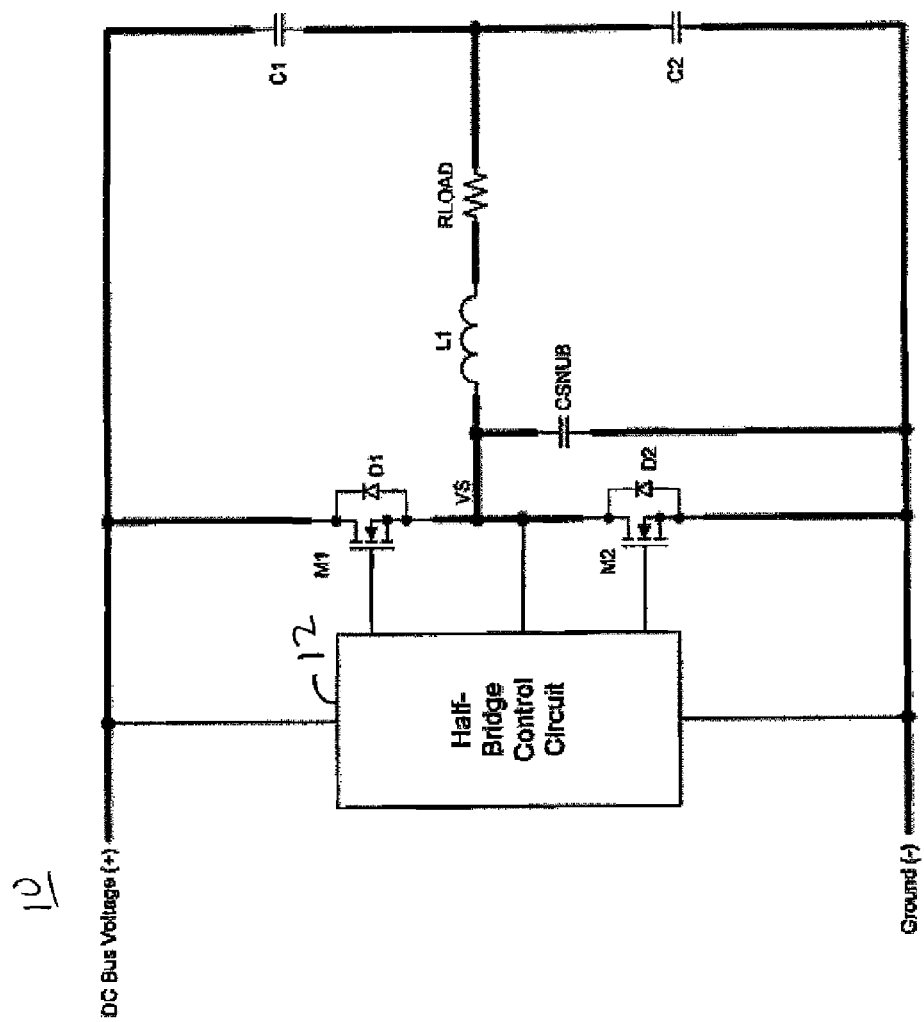
FIG. 1 is an illustration of a conventional half-bridge circuit.
Figure 2:
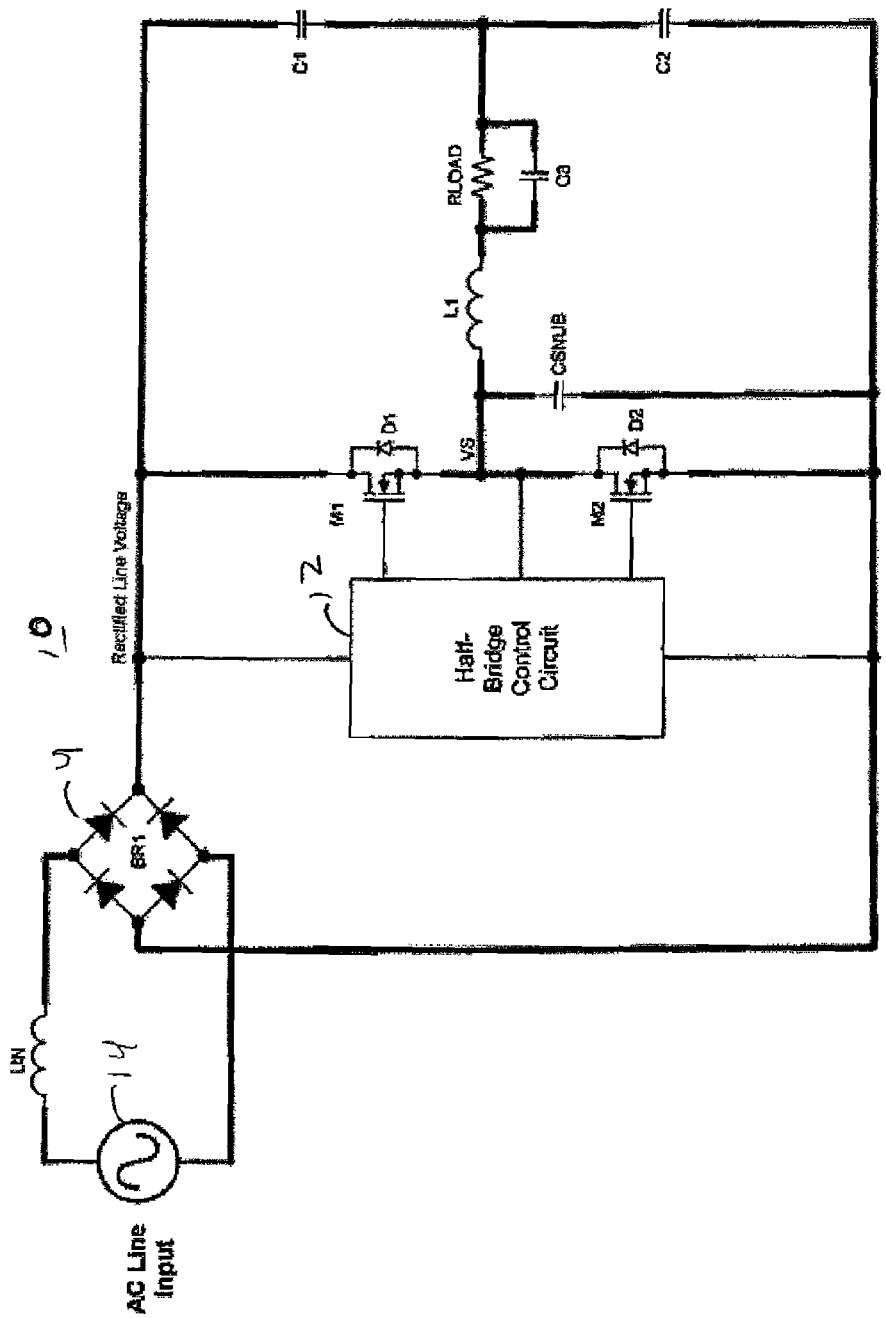
FIG. 2 is an illustration of the half-bridge circuit of FIG. 1 connected to a full bridge rectifier.
Figure 3A:
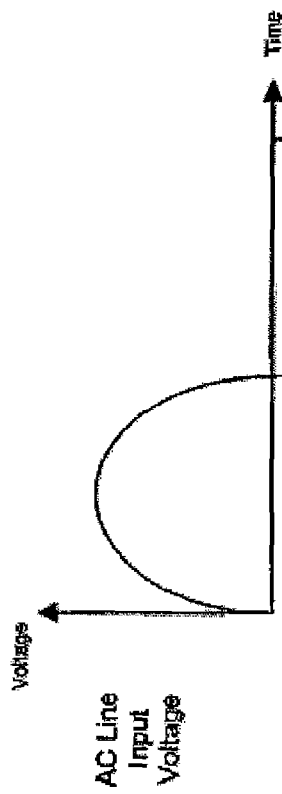
FIG. 3A is an illustration of the input AC voltage provided in the circuit of FIG. 2.
Figure 3B:
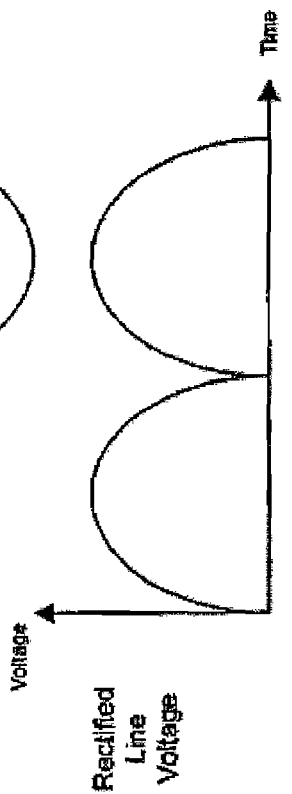
FIG. 3B is an illustration of a rectified waveform provided by the bridge rectifier of FIG. 2.
Figure 3C:
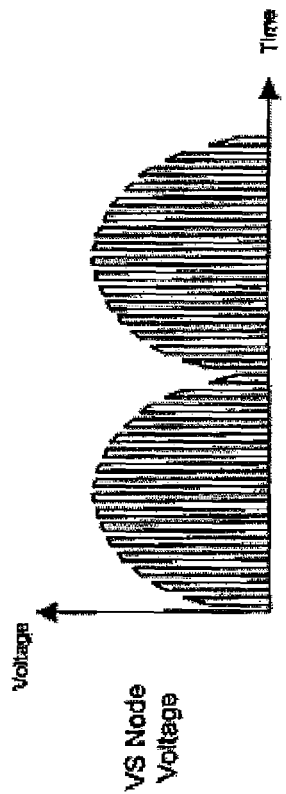
FIG. 3C is an illustration of the voltage at node VS of the circuit of FIG. 2.
Figure 13:
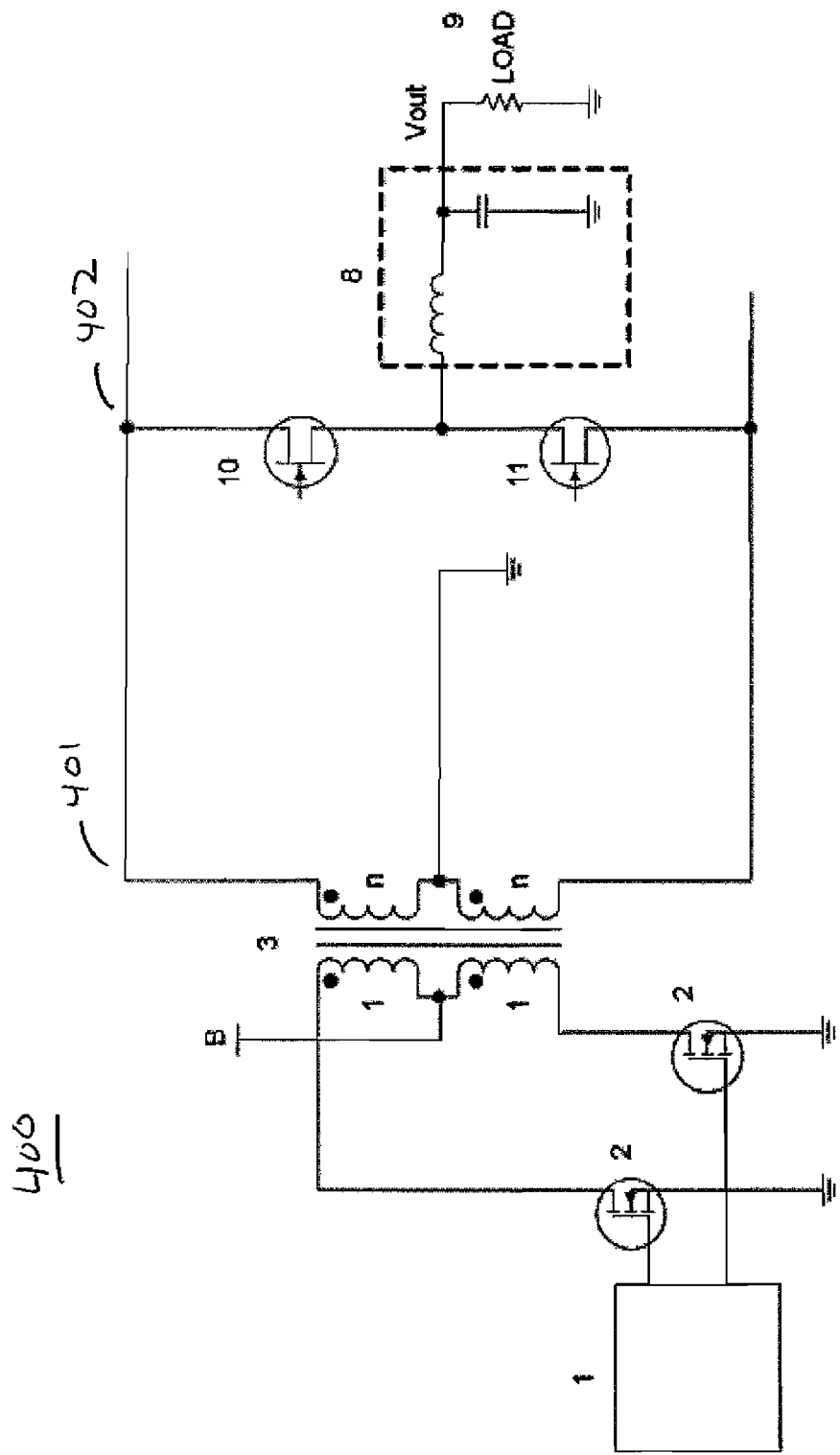
FIG. 13 is an illustration of a Class D amplifier circuit in accordance with an embodiment of the present application.

FIG. 13 illustrates the Class D amplifier circuit 400 in accordance with an embodiment of the present application. While this circuit operates in a manner similar to that of FIG. 11, the MOSFETS 6, 7 of FIG. 1 are replaced by the bi-directional power switches 10 and 11. These switches are preferably HEMT GaN type switches, similar to those utilized in the half-bridge of FIG. 4, for example. In addition, the Class D amplifier circuit 400 of the present application eliminates the need for the secondary rectifier 4 and the bus capacitors 5 since there is no longer a need for a DC bus at all. This makes the circuit significantly smaller and more efficient.

In general, the controller 1 controls the switches 2 to provide a desired voltage to the primary of the transformer 3. However, the secondary of the transformer 3 may be connected directly to the Class D amplifier stage 402, without the need for rectification. The converter stage 401 is substantially minimized in components and in space when compared to the circuit of FIG. 11.

In addition, error correction in the Class D amplifier stage 402 eliminates power supply dependency gain and removes the need for a regulated power supply stage, which also improves efficiency. The Class D amplifier circuit 400 uses a switched mode power supply with a bipolar output voltage such as a push-pull, half-bridge or full bridge. These devices may have high utilization of core magnetization in order to provide a smaller size.

The Class D amplifier circuit 400 of FIG. 13 represent a PWM converter that utilizes bi-directional power switches. There is not need for secondary rectification or for bus capacitors. Further, the PWM converter has an AC input and an AC output, where the frequency of the output is preferably lower than that of the input.

Figure 14:
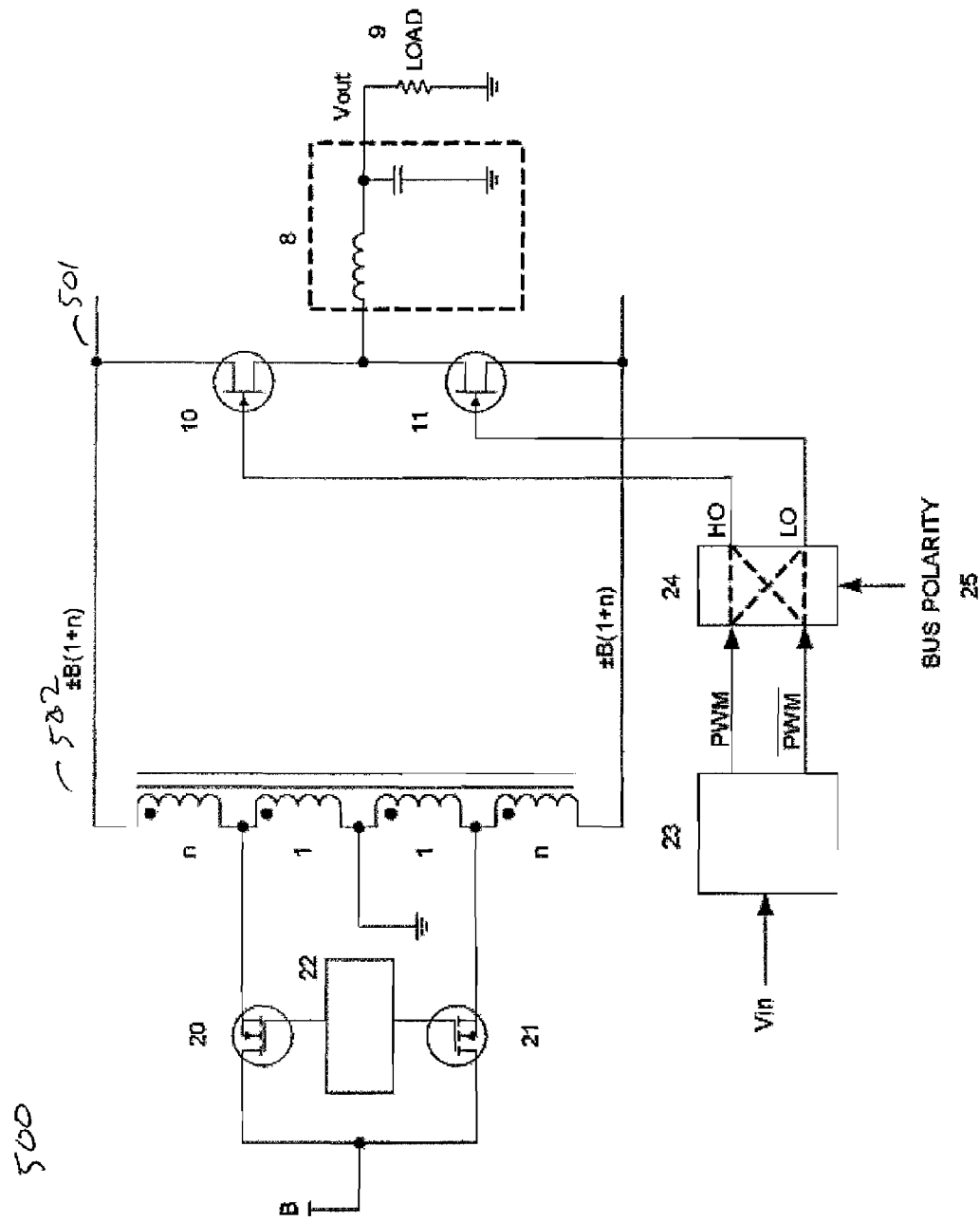
FIG. 14 is an illustration of a Class D amplifier circuit in accordance with another embodiment of the present application.
Figure 16:
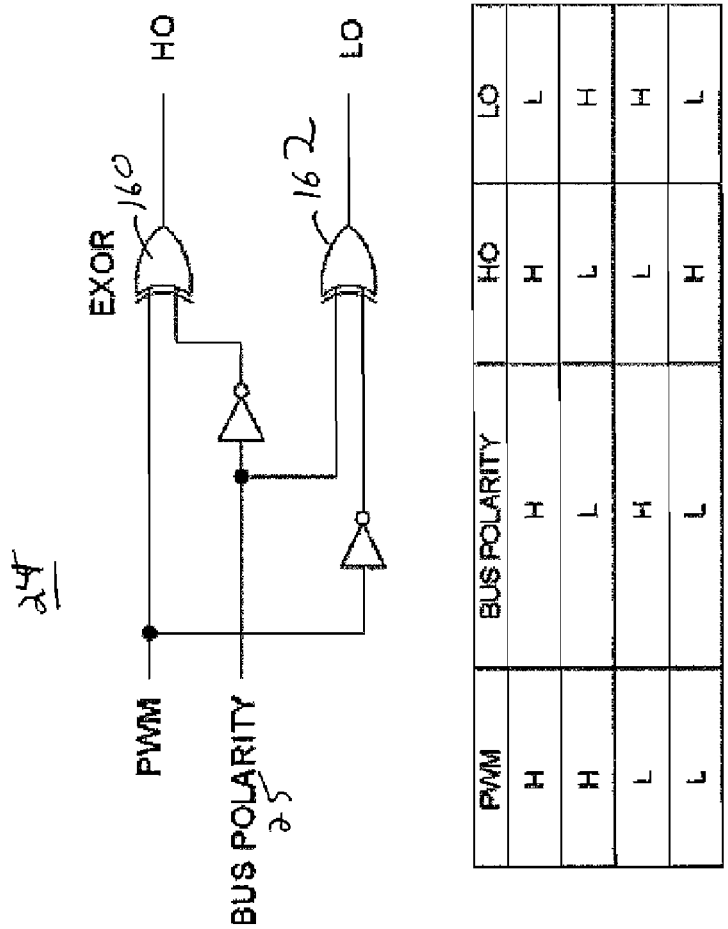
FIG. 16 is a more detailed view of a power switch selector for use in the circuit of FIG. 14.

FIG. 14 illustrates an alternative embodiment of a Class D amplifier circuit 500 in accordance with an embodiment of the present application. In this embodiment an auto-transformer based push-pull primary is utilized in the converter stage 501. The primary controller 22 controls the power switches 20 and 21 to provide the desired input voltage via the push-pull primary. PWM control is provided via the PWM controller 23 and the selector 24. Since the polarity of the input voltage may change, the selector 24 is used to select the appropriate PWM control signal to be provided to the switches 10, 11 based on the polarity indication signal 25. FIG. 16 illustrates a more detailed illustration of the power switch selector 24. As illustrated, the selector 24 uses logic gates 160, 162 and takes as inputs the PWM signal and the polarity indication signal 25 to provide the HO and LO signals to drive the switches 10 and 11 such that they are not ON at the same time.

Figure 15:
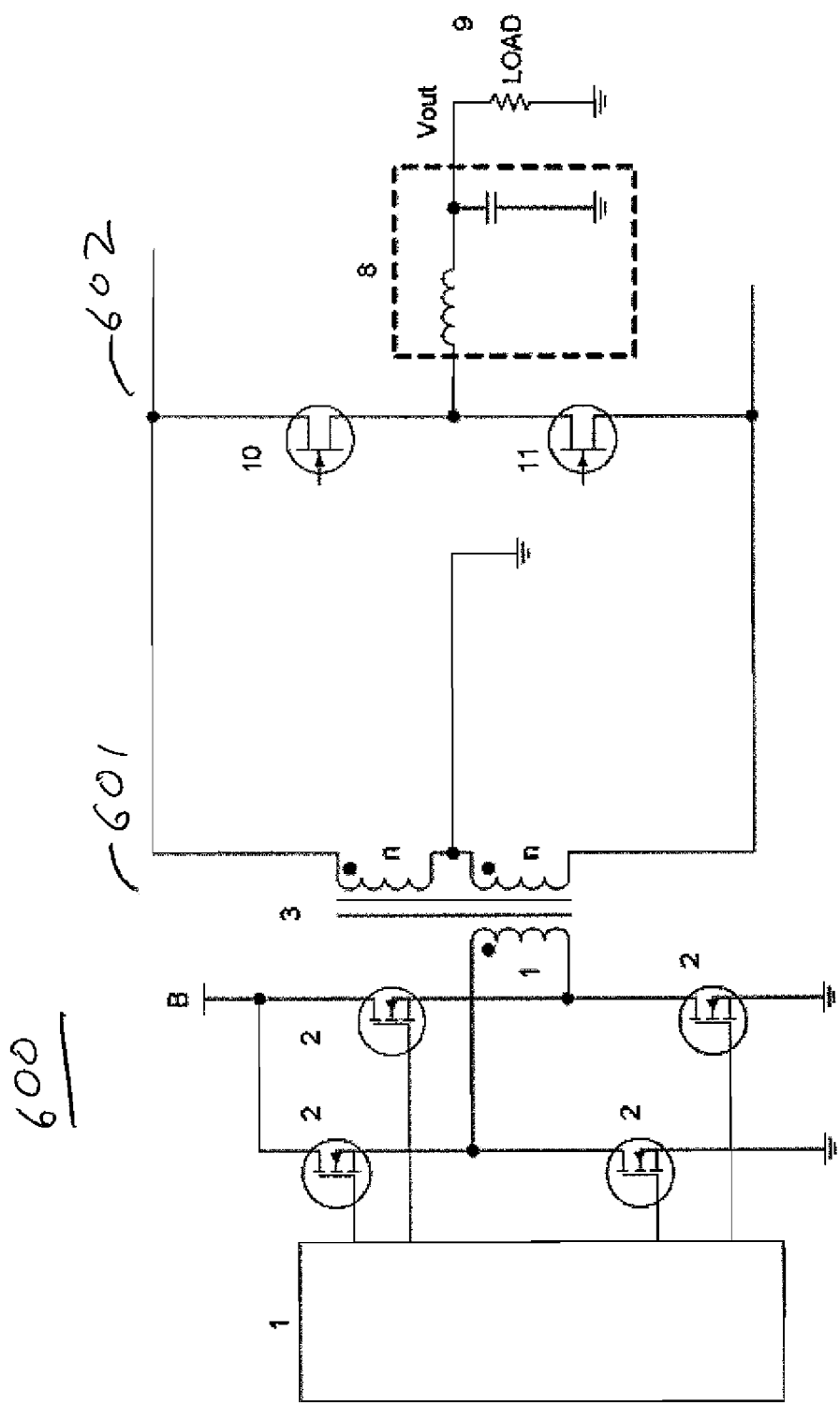
FIG. 15 is an illustration of a Class D amplifier circuit in accordance with another embodiment of the present application.

FIG. 15 illustrates another embodiment of a Class D amplifier circuit 600 in accordance with an embodiment of the present application wherein the primary of the transformer 3 is provide with an input voltage via a full bridge formed by the switches 2. Otherwise this circuit operates in substantially the same manner as that of FIG. 13.

Thus, the Class D amplifier circuit of the present application utilizes bi-directional power switches without internal diodes in order to eliminate the need for the secondary rectifier, DC bus and bus capacitors which saves space and reduces losses. The bi-directional power switches are preferably HEMT GaN type transistors of the type described herein. In this manner, the input voltage to the amplifier may be an AC input voltage.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A half-bridge circuit comprising:
   an input voltage terminal configured to receive an AC input voltage without a bridge rectifier;
   first and second high electron mobility transistors (HEMTs) coupled across said input voltage terminal;
   a control circuit configured to turn said first and second HEMTs ON and OFF such that a desired voltage is provided at a node positioned between said first and second HEMTs;
   wherein said first and second HEMTs prevent conduction in any direction when OFF.

2. The half-bridge circuit of claim 1, wherein said first and second HEMTs comprise III-nitride devices.

3. The half-bridge circuit of claim 1, wherein said first and second HEMTs comprise gallium nitride (GaN).

4. The half-bridge circuit of claim 1, wherein said first and second HEMTs are connected between a positive terminal and a negative terminal of said input voltage terminal.

5. The half-bridge circuit of claim 1, wherein the first and second HEMTs do not include internal diodes.

6. The half-bridge circuit of claim 5, further comprising:
   a transformer connected between said node and a load;
   a rectifier bridge connected to said transformer and to said load.

7. The half-bridge of claim 6, wherein a primary coil of said transformer is connected to said node and a secondary coil of said transformer is connected to said rectifier bridge such that a DC output voltage is provided to said load.

8. The half-bridge of claim 1, further comprising a zero crossing circuit configured to determine when a voltage at said node crosses zero.

9. The half-bridge of claim 8, wherein said zero crossing circuit is included in said control circuit and provides a zero detect signal indicating when said voltage crosses zero.

10. The half-bridge of claim 9, wherein said first and second HEMTs are turned ON by said control circuit based on said zero detect signal.

* * * * *